(12) United States Patent
Philips et al.

(10) Patent No.: US 8,638,417 B2
(45) Date of Patent: Jan. 28, 2014

(54) FLUID HANDLING STRUCTURE, LITHOGRAPHIC APPARATUS AND A DEVICE MANUFACTURING METHOD

(75) Inventors: Danny Maria Hubertus Philips, Son en Breugel (NL); Daniel Jozef Maria Direcks, Simpelveld (NL); Clemens Johannes Gerardus Van Den Dungen, Someren (NL); Maikel Adrianus Cornelis Schepers, Nuenen (NL); Paul Petrus Joannes Berkvens, Veldhoven (NL); Marcus Johannes Van Der Zanden, Boekel (NL); Pieter Mulder, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 322 days.

(21) Appl. No.: 13/085,069

(22) Filed: Apr. 12, 2011

(65) Prior Publication Data
US 2011/0255062 A1    Oct. 20, 2011

Related U.S. Application Data

(60) Provisional application No. 61/324,642, filed on Apr. 15, 2010, provisional application No. 61/352,588, filed on Jun. 8, 2010.

(51) Int. Cl.
*G03B 27/52* (2006.01)
*G03B 27/42* (2006.01)

(52) U.S. Cl.
USPC ............................................. 355/30; 355/53

(58) Field of Classification Search
USPC ............................................. 355/30, 53, 72
See application file for complete search history.

(56) References Cited

U.S. PATENT DOCUMENTS

| | | | |
|---|---|---|---|
| 4,509,852 A | 4/1985 | Tabarelli et al. | |
| 7,508,490 B2* | 3/2009 | Nagasaka et al. | 355/53 |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0119809 A1 | 6/2006 | Verhagen et al. | |
| 2006/0250593 A1* | 11/2006 | Nishii | 355/53 |

(Continued)

FOREIGN PATENT DOCUMENTS

| | | |
|---|---|---|
| EP | 1 420 300 | 5/2004 |
| JP | 2005-183744 | 7/2005 |

(Continued)

OTHER PUBLICATIONS

Korean Office Action mailed Aug. 20, 2012 in corresponding Korean Patent Application No. 10-2011-0034674.

(Continued)

*Primary Examiner* — Hung Henry Nguyen
(74) *Attorney, Agent, or Firm* — Pillsbury Winthrop Shaw Pittman LLP

(57) ABSTRACT

A fluid handling structure configured to supply immersion liquid to a space defined between a projection system and a facing surface facing the fluid handling structure is disclosed. An undersurface of the fluid handling structure has a supply opening configured to supply fluid toward the facing surface, a plurality of extraction openings configured to remove fluid from between the fluid handling structure and the facing surface, and a protrusion between the supply opening and the extraction openings.

25 Claims, 13 Drawing Sheets

(56) References Cited

U.S. PATENT DOCUMENTS

| | | |
|---|---|---|
| 2007/0242256 A1 | 10/2007 | Van De Kerkhof |
| 2008/0212046 A1 | 9/2008 | Riepen et al. |
| 2009/0279060 A1 | 11/2009 | Direcks et al. |
| 2010/0313974 A1 | 12/2010 | Riepen et al. |
| 2011/0013158 A1 | 1/2011 | Philips et al. |

FOREIGN PATENT DOCUMENTS

| | | |
|---|---|---|
| JP | 2005-353820 | 12/2005 |
| JP | 2006-019720 | 1/2006 |
| JP | 2008-147652 | 6/2008 |
| KR | 10-2006-0128877 | 12/2006 |
| KR | 10-2007-0101818 | 10/2007 |
| KR | 10-2007-0115857 | 12/2007 |
| WO | 99/49504 | 9/1999 |
| WO | 2005/041276 | 5/2005 |
| WO | 2005/064405 | 7/2005 |
| WO | 2006/106851 | 10/2006 |

OTHER PUBLICATIONS

Japanese Office Action mailed Sep. 25, 2012 in corresponding Japanese Patent Application No. 2011-087936.

Chinese Office Action dated Jan. 18, 2013 in corresponding Chinese Patent Application No. 201110094314.9.

* cited by examiner

-- PRIOR ART -- distance wafer to NWE [um]

FLUID HANDLING STRUCTURE, LITHOGRAPHIC APPARATUS AND A DEVICE MANUFACTURING METHOD

This application claims priority and benefit under 35 U.S.C. §119(e) to U.S. Provisional Patent Application Ser. No. 61/324,642, entitled "Fluid Handling Structure, Lithographic Apparatus and A Device Manufacturing Method", filed on Apr. 15, 2010, and to U.S. Provisional Patent Application Ser. No. 61/352,588, entitled "Fluid Handling Structure, Lithographic Apparatus and A Device Manufacturing Method", filed on Jun. 8, 2010. The contents of those applications are incorporated herein in their entirety by reference.

FIELD

The present invention relates to a fluid handling structure, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

It is desirable, for example, to provide a fluid handling system which maintains liquid in a space between the final element of the projection system and the substrate.

According to an aspect, there is provided a fluid handling structure configured to supply immersion liquid to a space defined between a projection system and a facing surface facing the fluid handling structure, wherein an undersurface of the fluid handling structure has: a supply opening configured to supply fluid toward the facing surface; a plurality of extraction openings configured to remove fluid from between the fluid handling structure and the facing surface; and a protrusion between the supply opening and the extraction openings.

According to an aspect, there is provided a fluid handling structure configured to supply immersion liquid to a space defined between a projection system and a facing surface facing the fluid handling system, wherein an undersurface of the fluid handling structure has: a supply opening configured to supply fluid toward the facing surface; and a protrusion radially inward with respect to an optical axis of the projection system of the supply opening.

According to an aspect, there is provided a fluid handling structure configured to supply immersion liquid to a space between a projection system and a facing surface facing the fluid handling system, wherein formed in an undersurface of the fluid handling structure is: one or more of supply openings to supply immersion liquid towards the facing surface; and a step in the surface of the undersurface radially outward of the one or more supply openings with respect to a geometric center of the undersurface, the step configured to reduce the radially outward flow of immersion liquid from the space.

According to an aspect, there is provided an immersion lithographic apparatus comprising: a projection system to project a beam of radiation onto a substrate supported by a substrate table; and a fluid handling structure as disclosed herein, wherein the facing surface is the surface of the substrate and/or the surface of the substrate table.

According to an aspect, there is provided a device manufacturing method comprising: providing a fluid between a final element of a projection system and a substrate; wherein the providing includes supplying liquid towards the substrate through a supply opening in an undersurface of the fluid handling structure and removing fluid from between the fluid handling structure and the substrate and/or substrate table through an extraction opening in the undersurface of the fluid handling structure, wherein a protrusion is provided on the undersurface between the supply opening and the extraction opening.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
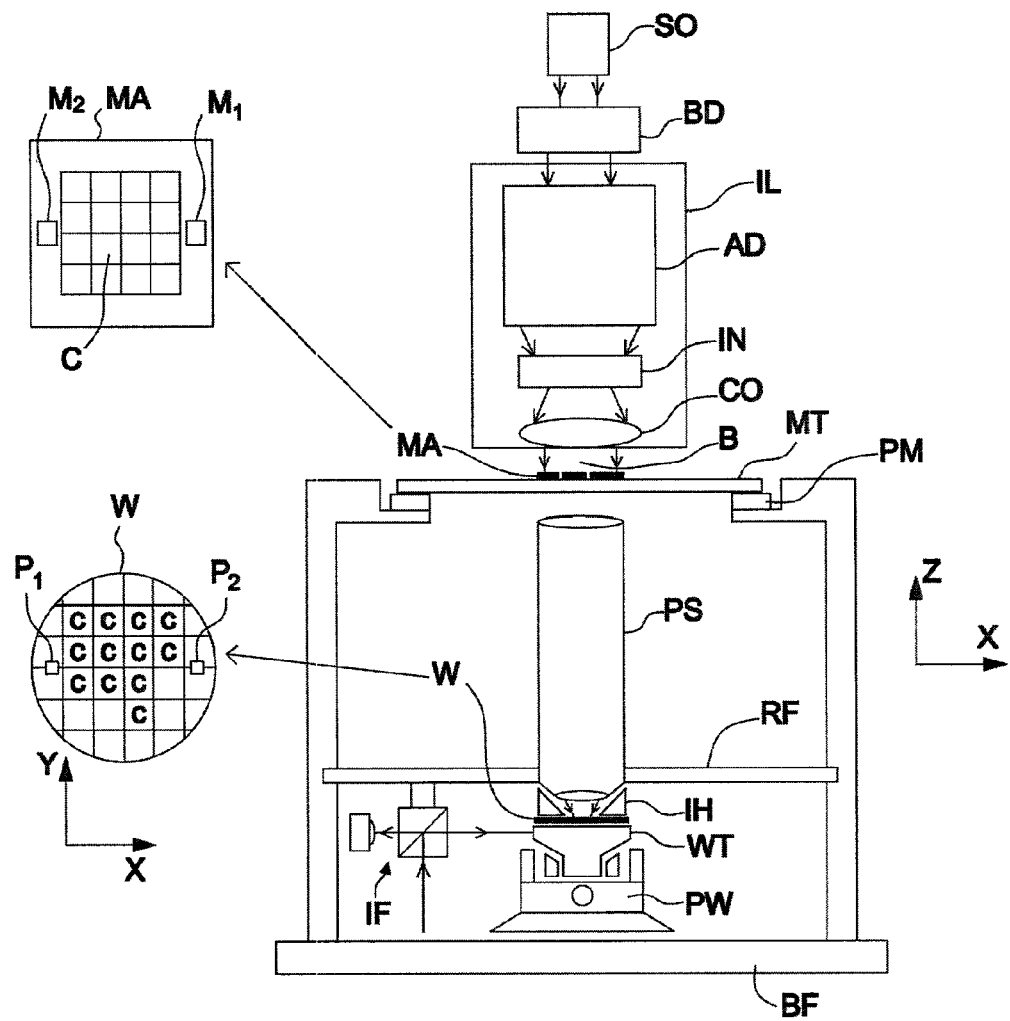
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables at least one or all of which may hold a substrate (and/or two or more patterning device tables). In such "multiple stage" machines the additional tables may be used in parallel, or preparatory steps may be carried out on one or more tables while one or more other tables are being used for exposure. An embodiment may have two or more tables, one of which is configured to support a substrate. Another of the tables may support one or more sensors for example to sense a property of the projection beam.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called 'localized' immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
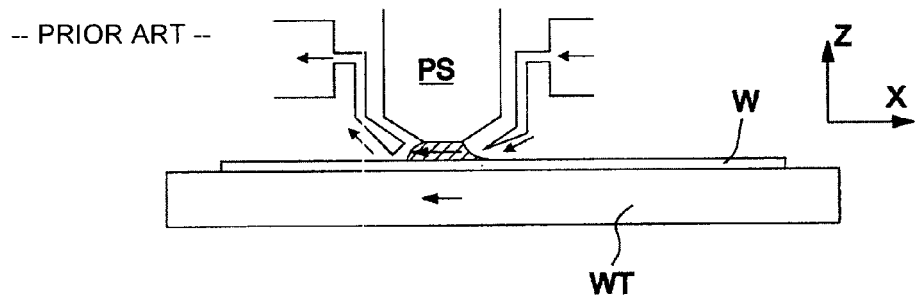
FIGS. 2 and 3 depict a liquid supply system for use in a lithographic projection apparatus.
Figure 3:
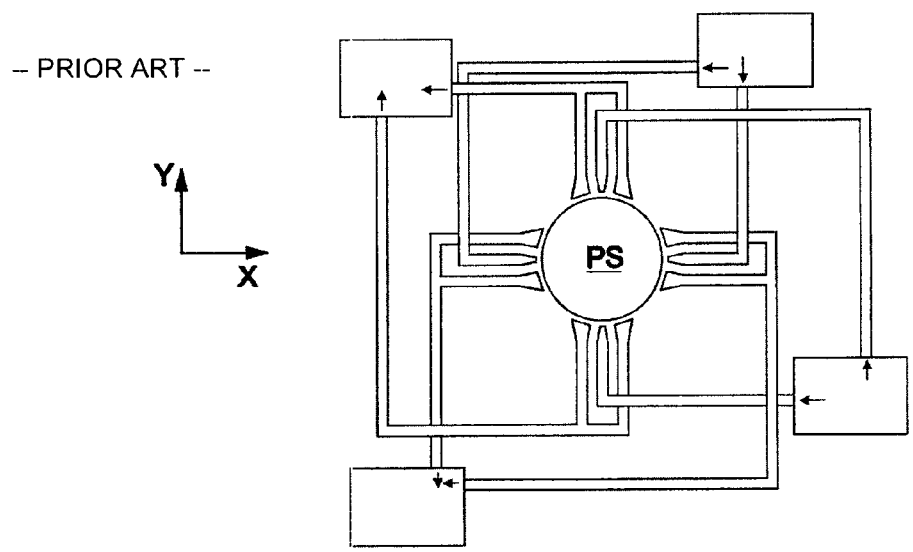

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in-and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
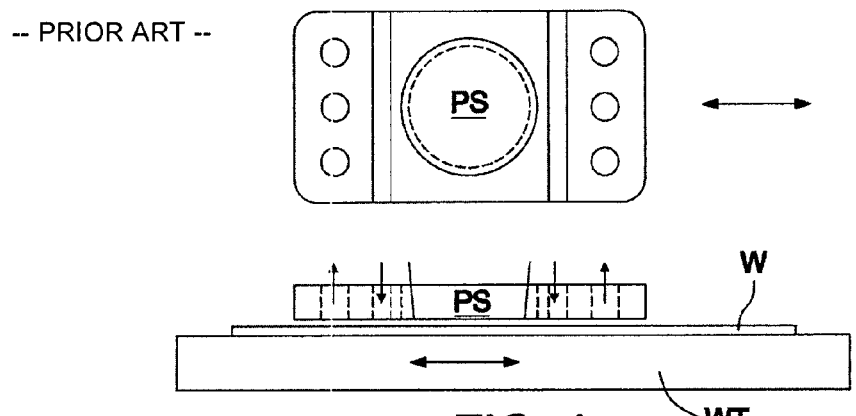
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. In an arrangement, the apparatus has only one table, or has two tables of which only one can support a substrate. In an embodiment, the apparatus has more than two tables, one of which is configured not to support a substrate.

PCT patent application publication no. WO 2005/064405 discloses an all wet arrangement in which the immersion liquid is unconfined In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Figure 5:
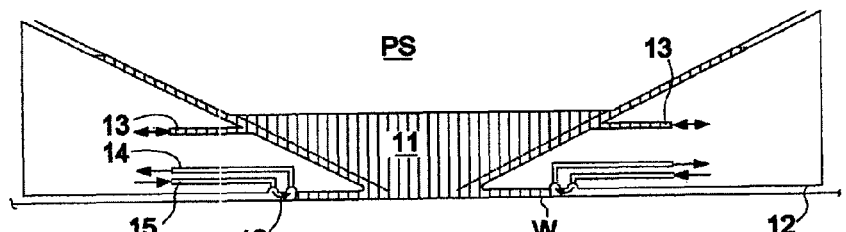
FIG. 5 depicts a further liquid supply system for use in a lithographic projection apparatus.

Another arrangement which has been proposed is to provide the liquid supply system with a fluid handling structure. The fluid handling structure may extend along at least a part of a boundary of the space between the final element of the projection system and the substrate table. Such an arrangement is illustrated in FIG. 5. The fluid handling structure is substantially stationary relative to the projection system in the XY plane though there may be some relative movement in the Z direction (in the direction of the optical axis). A seal is formed between the fluid handling structure and the surface of the substrate. In an embodiment, a seal is formed between the fluid handling structure and the surface of the substrate and may be a contactless seal such as a gas seal. Such a system is disclosed in United States patent application publication no. US 2004-0207824. In another embodiment the fluid handling structure has a seal which is a non-gaseous seal, and so may be referred to as a liquid confinement structure.

FIG. 5 schematically depicts a localized liquid supply system or fluid handling structure or device with a body 12 forming a barrier member or liquid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise. The substrate (and co-planar surface of the substrate table) may present itself as a facing surface facing an underside of the fluid handling structure. The liquid handling structure is substantially stationary relative to the projection system PS in the XY plane though there may be some relative movement in the Z direction (generally in the direction of the optical axis). In an embodiment, a seal is formed between the body 12 and the surface of the substrate W and may be a contactless seal such as a gas seal or fluid seal.

The fluid handling structure at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling structures which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly lyophilic (e.g., hydrophilic), i.e. having a contact angle of less than 90° to the immersion liquid, e.g. water.

Figure 6:
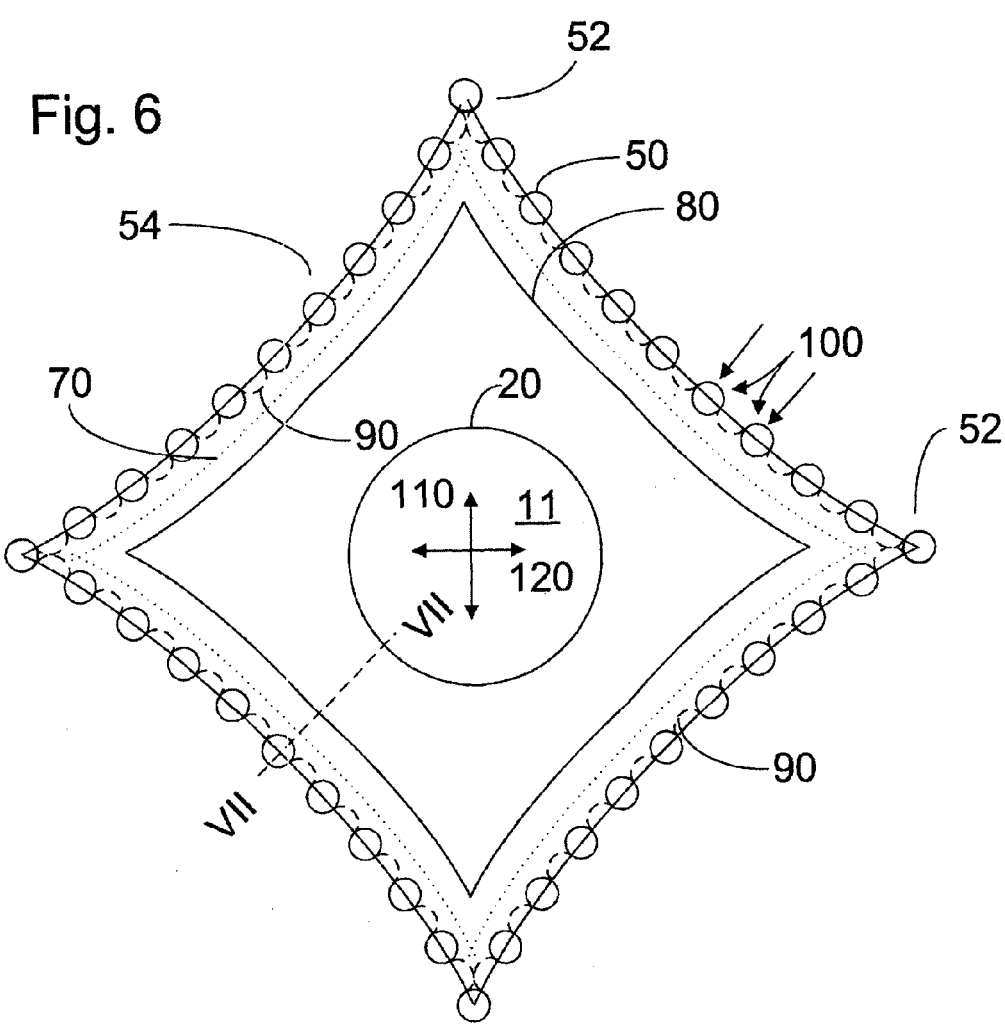
FIG. 6 is a schematic illustration, in plan, of a fluid handling structure.

FIG. 6 illustrates a meniscus pinning device of an embodiment of the present invention which may, for example, replace the seal arrangement 14, 15, 16 of FIG. 5. The meniscus pinning device of FIG. 6 comprises a plurality of discrete (extraction) openings 50. Each opening 50 is illustrated as being circular though this is not necessarily the case. Indeed the shape of one or more of the openings 50 may be one or more selected from a square, a circle, a rectilinear shape, a rectangle, an oblong, a triangle, an elongate shape such as a slit, etc. Each opening 50 has, in plan, a large maximum cross-sectional dimension, such as a diameter, perhaps with a maximum dimension of about 0.35 mm (e.g. 0.25 mm square) or of greater than 0.5 mm, desirably greater than 1 mm. Thus, the openings 50 are unlikely to be affected much by contamination.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the liquid supply system may be increased in pressure to generate the required under pressure.

Each opening 50 is designed to extract a mixture of liquid and gas, for example in a two phase flow. The liquid is extracted from the space 11 whereas the gas is extracted from the atmosphere on the other side of the openings 50 to the liquid. This creates a gas flow as illustrated by arrows 100. This gas flow is effective to pin the meniscus 90 between the openings 50 substantially in place as illustrated in FIG. 6, for example between neighboring openings 50. The gas flow helps maintain the liquid confined by momentum blocking, by a gas flow induced pressure gradient and/or by drag (shear) of the gas flow on the liquid.

As can be seen from FIG. 6, the openings 50 are positioned so as to form, in plan, a polygonal shape. In the case of FIG. 6 this is in the shape of a rhombus with the principal axes 110, 120 aligned with the major directions of travel of the substrate W under the projection system PS. This helps ensure that the maximum scan speed is faster than if the openings 50 were arranged in a circular shape. This is because the force on the meniscus between two openings 50 is reduced with a factor $\cos\theta$, where $\theta$ is the angle of the line connecting the two openings 50 relative to the direction in which the substrate W is moving. Thus, throughput can be optimized by having the primary axis 110 of the shape of the openings 50 aligned with the major direction of travel of the substrate (usually the scan direction) and to have a second axis 120 aligned with the other major direction of travel of the substrate (usually the step direction). It will be appreciated that any arrangement in which $\theta$ is different to 90° will give an advantage. Thus, exact alignment of the principal axes with the major directions of travel is not vital. It will further be appreciated that if the shape is circular, then there will always be two openings 50 which are aligned perpendicularly to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. However, embodiments of the present invention are applicable to any shape made by the openings 50 in plan, for example a circle.

Figure 15:
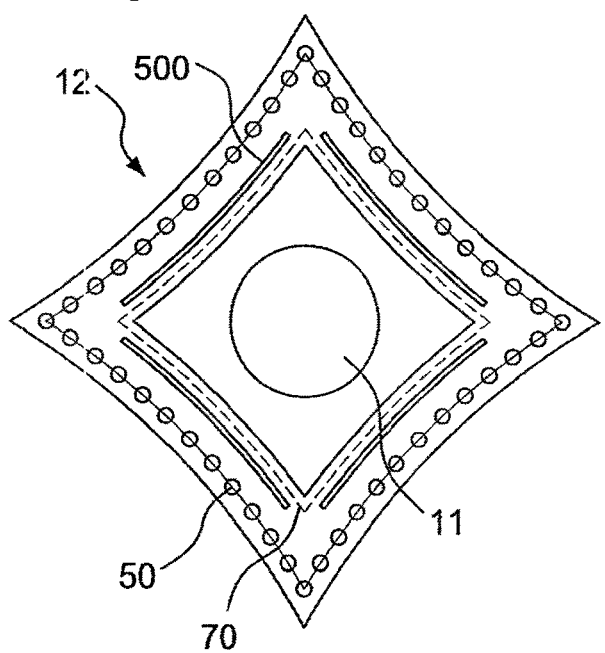
FIG. 15 illustrates schematically, in plan view, the undersurface of a fluid handling structure according to an embodiment of the present invention.

Radially outward of the openings may be a gas knife opening through which a gas flow may be supplied during operation. Such an arrangement is illustrated in FIG. 15 and described in United States Patent Application Publication No. US 2010-0313974, which is hereby incorporated by reference in its entirety.

Figure 7:
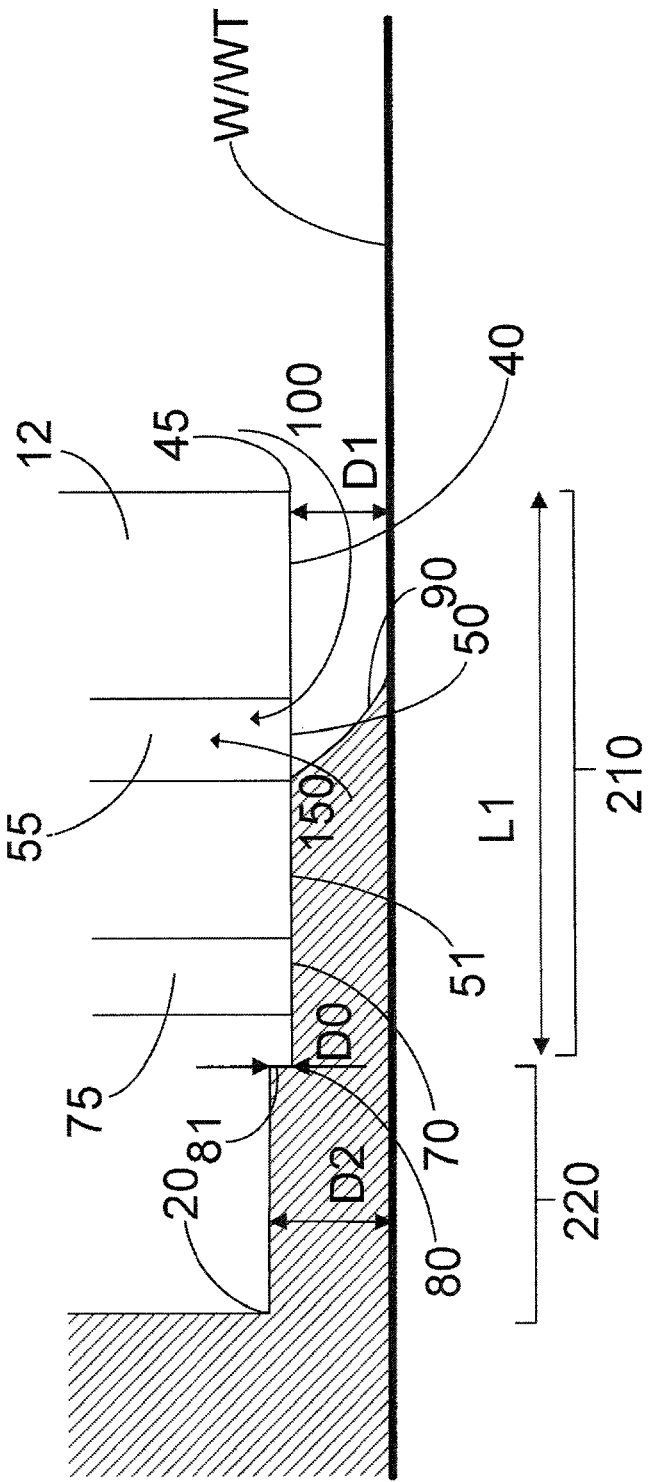
FIG. 7 depicts, in cross-section in a plane substantially parallel to the optical axis of the projection system, a fluid handling structure.

FIG. 7 is a cross-section through the fluid handling structure along the line VII-VII shown in FIG. 6. In FIG. 7 an arrow 100 shows the flow of gas from outside of the fluid handling structure 12 into the passageway 55 associated with the opening 50. The arrow 150 illustrates the passage of liquid from under the fluid handling structure 12, which may have come from the space 11 or opening 70 described below, into the opening 50. The passageway 55 and opening 50 are designed so that two phase extraction (i.e. gas and liquid) desirably occurs in an annular flow mode. In annular flow mode gas substantially flows through the center of the passageway 55 and liquid substantially flows along the walls of the passageway 55. This results in smooth flow with low generation of pulsations, thereby minimizing or reducing the vibrations which may otherwise occur.

The meniscus 90 is pinned by the openings 50 (for example a part of a rim of the openings 50) with drag forces induced by gas flow into the openings 50. In an embodiment, a gas drag velocity of greater than about 15 m/s, desirably 20 m/s is sufficient. In an embodiment there is no gas knife. By avoiding the use of a gas knife, the amount of evaporation of liquid from the substrate W may be reduced thereby reducing both splashing of liquid as well as thermal expansion/contraction effects.

A plurality of discrete passages 55 (e.g. around forty (40), such as thirty-six), which may be in the form of needles, each with a diameter of 1 mm and separated by distance in the range of 2 to 5 mm, for example 3.9 mm, may be effective to pin a meniscus. The total gas flow in such a system is of the order of magnitude of 100 l/min.

Further details of the openings 50 and the fluid handling structure 12 can be found in United States Patent Application Publication No. US 2008/0212046, which is hereby incorporated by reference in its entirety.

Formed in the undersurface 40 is one or more supply openings 70 to outlet fluid (e.g. liquid, such as immersion liquid) from the fluid handling structure 12. A supply opening 70 may be considered as inletting (or for supplying) liquid into the space 11. The supply opening 70 is radially inwardly, with respect to the optical axis of the projection system PS, of the extraction openings 50. The supply and extraction openings 50, 70 may be separated by a surface 51. The liquid passing through passage 75 and exiting the opening 70 of the fluid handling structure 12 is directed towards the substrate W. The supply opening 70 is provided in order to reduce the chances of bubbles being generated, for example included, in the immersion liquid. Gas may become trapped, or included, in a gap between the edge of the substrate W and the substrate table WT.

At an advancing part of the undersurface of the fluid handling structure 12, the fluid handling structure may be moving sufficiently fast relative to the facing surface of the substrate W such that liquid is unable to flow from the space 11 to the openings 50. The undersurface is formed between an outer edge or rim 45 at its most radially outward edge, and an inner edge at its most radially inward edge. A portion of the undersurface of the fluid handing structure 12 between the inner edge 20 of the undersurface 40 and the openings 50 may become de-wetted. A de-wetted part of the undersurface 40 radially inward of the openings 50 may affect the effectiveness of the meniscus pinning of the openings 50. Supplying liquid through the supply opening 70, desirably near the opening 50, thereby reduces the risk of bubble inclusion and de-wetting.

The geometry of the supply opening 70 has an impact upon the effectiveness of the fluid handling structure 12 in containing liquid.

In particular, it is desirable that a plurality of supply openings 70 has a shape, in plan, along the undersurface, for example around the space, which is cornered, like the shape of the openings 50, in plan. (Note that in an embodiment there is just one supply opening 70.) Indeed, the cornered shapes of the supply openings 70 and openings 50 are desirably substantially similar. In an embodiment, each shape has, at the apex of each corner 52 a supply opening 70 or opening 50.

Desirably the supply opening 70 is within 10 mm, desirably 5 mm of an opening 50. All parts of the shape made by the openings 50 may be within 10 mm of a part of the shape made by the supply opening 70.

Further details regarding the extraction openings 50 and supply openings 70 may be found in United States Patent Application Publication No. US 2009/0279060, which is hereby incorporated by reference in its entirety.

An under pressure is generated between the extraction openings 50 and the facing surface of the substrate W, the substrate table WT or parts of both. The closer the undersurface 40 is to the facing surface, the stronger is the flow of gas 100 and thereby the better the pinning of the meniscus 90 in position. The greater the under pressure between the extraction opening 50 and the substrate W or substrate table WT, the greater the gas flow 100 and thereby the more stable the position of the meniscus 90. The under pressure between the opening 50 and the facing surface W, WT results in an attractive force of the fluid handling structure 12 towards the facing surface W, WT.

The flow of liquid out of the supply opening 70 results in a repulsive force between the facing surface W, WT and the fluid handling structure 12.

For a normal separation between the fluid handling structure 12 and the substrate W and/or substrate table WT, the total force (the sum of the attractive force from extraction opening 50, the repulsive force from the supply opening 70 and gravity) is an attractive force. The stiffness of the fluid handling structure 12 (for example in the Z direction or Z axis, which may be the direction of the optical axis of the projection system PS and/or in a direction generally perpendicular to the surface of the substrate) represents how the force level changes with variations in distance between the fluid handling structure 12 and the substrate W and/or substrate table WT. In an embodiment, stiffness is the derivative of total force on the y axis versus distance between the undersurface 40 of the fluid handling structure 12 and the substrate and/or substrate table WT along the x axis. In an embodiment the x and y axes may be in a plane parallel to the undersurface of the fluid handling structure. The x and y axes may be in a plane generally parallel to the surface of the substrate.

If the stiffness of the fluid handling structure 12 is too high at typical operating distances from the substrate W and/or substrate table WT a focusing error may result. A focusing error may result because there is often a position error in the height of the fluid handling structure 12 above the substrate W and/or substrate table WT. Any variation from the desired height results in a difference in force with respect to the nominal (and calibrated) value. The difference in force leads to a displacement of the substrate W from the expected position and thereby a focusing error.

The present invention is not limited to any particular type of liquid supply system. The present invention may be advantageous for use with a confined immersion system in which the liquid between the final element of the projection system and the substrate is confined, for example, in optimizing the use. However, the invention can be used with any other type of liquid supply system, which may be referred to herein.

As can be seen in FIG. 7, the extraction openings 50 and supply openings 70 are formed in a first portion 210 of the undersurface 40. The plan area of the first portion 210 may have a large influence on the stiffness of the fluid handling structure 12.

The plan area of the first portion 210 can be decreased by forming a second portion 220 on the undersurface 40 of the fluid handling structure 12. As compared to the first portion 210, the second portion 220, in use, is a different distance from the substrate W and/or substrate table WT. The second portion 220 is in a different plane to the first portion 210. In order to achieve the difference in distance from the facing surface W, WT between the first and second portions 210, 220 the undersurface 40 of the fluid handling structure 12 is not planar and may not be flat. In an embodiment, at least a portion of the undersurface 40 of the fluid handling structure 12 is at an angle to the top surface of the substrate W and/or substrate table WT.

In an embodiment the second portion 220 is radially inward of the first portion 210. The second portion 220 may extend between the inner edge 20 of the undersurface 40 and the first portion 210.

In FIG. 7 the distance of the first portion 210 from the second portion 220 along the Z axis is illustrated as D0. The distance of the first portion 210 from the substrate W and/or substrate table WT is illustrated as dimension D1. The distance of the second portion 220 from the substrate and/or substrate table WT, as illustrated, is D2. The difference between D1 and D2 is D0. In an embodiment, the dimension D2 is greater than D1. Desirably the dimension D2 is at least two times, more desirably at least three or four times the dimension D1. So the dimension of D0 is at least the same as D1, desirably twice as large or more desirably three times as large as D1. In use, dimension D1 may be in the range of 100-300 microns, desirably 130-230 microns. In the embodiment of FIG. 7, a step change in height 80 is present between the first portion 210 and the second portion 220. The step change forms a step edge 81 in the undersurface 40, as shown in FIG. 6.

The step may be described as a discontinuous change in the undersurface. In an embodiment the surface of the step between the first and second portions 210, 220 may be angled with respect to one or both of the first and second portions. The surface of the step edge 81 may be planar. In an embodiment, surface of the step edge 81 between the first and second portions 210, 220 may be perpendicular to one or both of the surfaces of the first and second portions. There may be two discontinuous angle changes in the undersurface 40 with respect to the z axis between the first and second portions 210, 220: for example, between the first portion 210 and the surface of the step edge 81, and between the surface of the step edge 81 and the second portion 220. However, this is not necessarily the case.

In an embodiment, the step edge 81 may take the form of a smooth surface without a discontinuous angle change between the step edge 81 and at least one of the first and second portions 210, 220. In an embodiment, the step edge 81 may form a smooth continuous surface between the first and second portions 210, 220.

Figure 8:
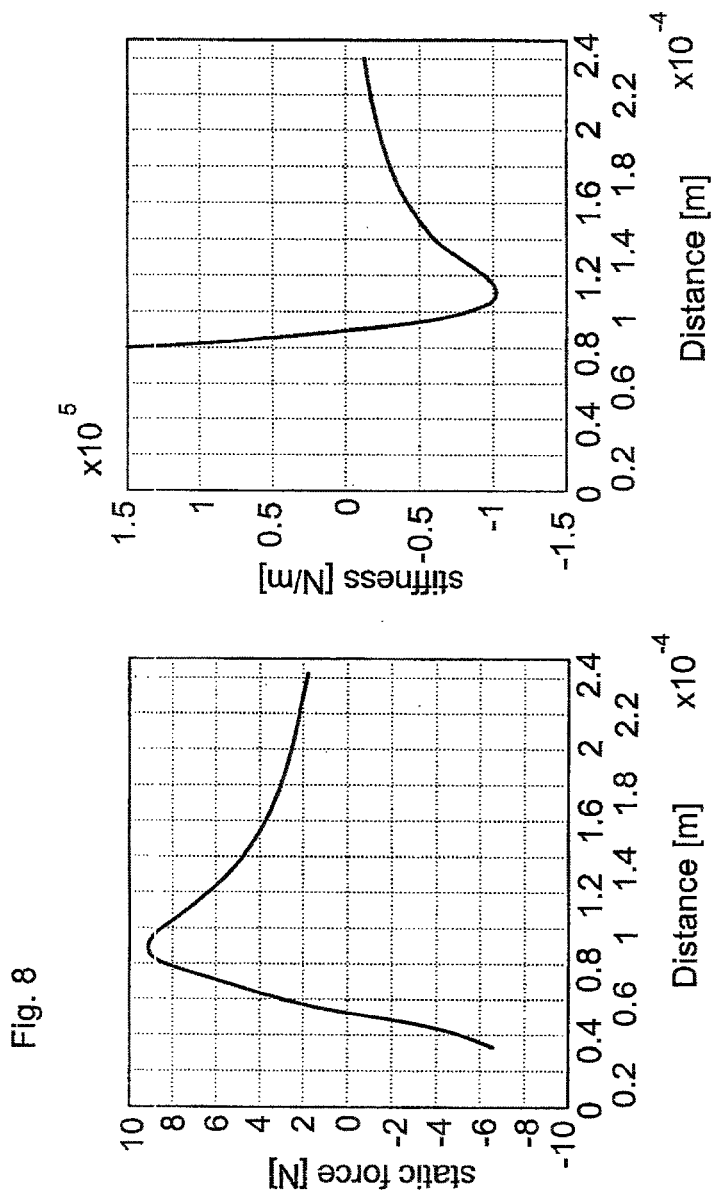
FIG. 8 depicts graphs of static force (left graph) and stiffness (right graph) on the y axis versus distance of the fluid handling structure from the facing surface on the x axis.

The fluid handling structure 12 may operate according to the gas drag principle. There is an under pressure below the openings 50 of the fluid handling structure 12 which may result in an attractive force towards the substrate W. Although the supply opening 70 results in a repulsive force, for operational (e.g. normal) flight heights (e.g. a distance of the undersurface 40 above the substrate W) the total force towards the substrate W is an attractive force. The stiffness represents how the magnitude of the force changes for flight height differences. These are explained in FIG. 8.

Figure 9:
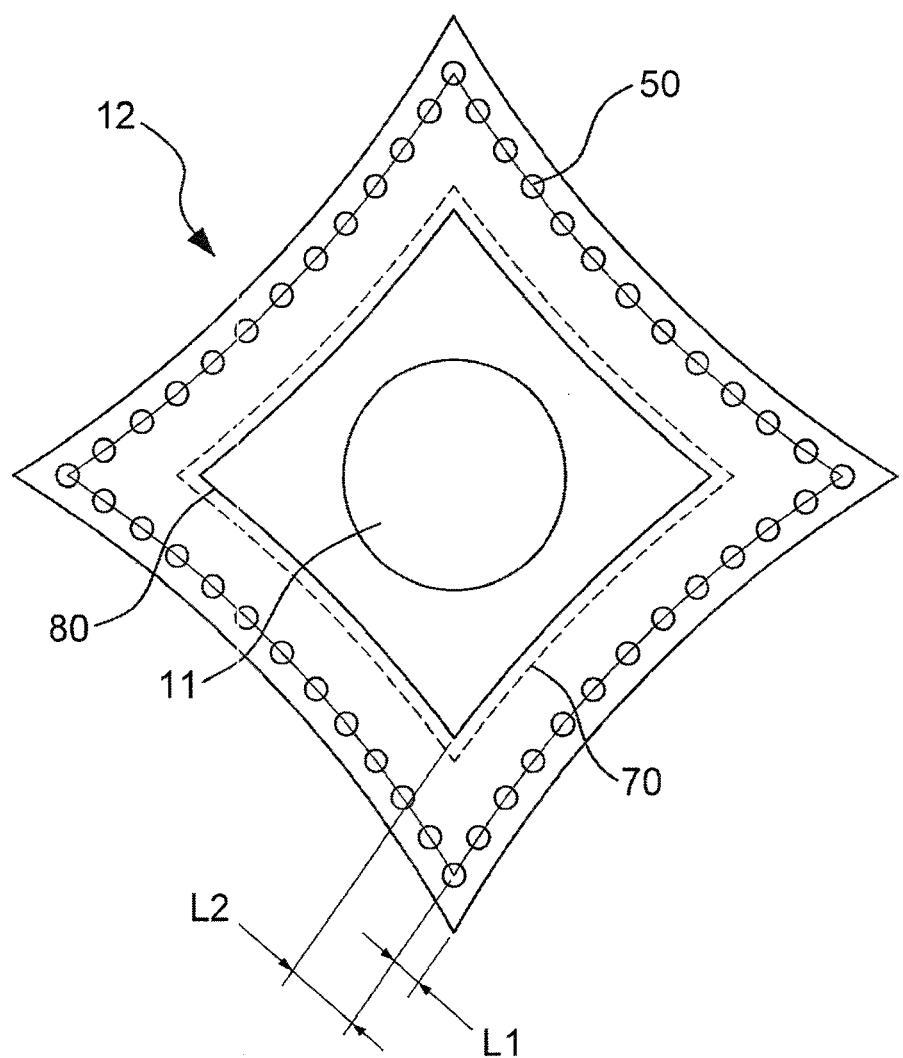
FIG. 9 depicts a plan view of an undersurface of a fluid handling structure.

A too high force level or a too high stiffness may result in a focus error. To vary the maximum relative speed (e.g. the scan speed) between the undersurface 40 and the facing surface WT, W, various parameters may be varied. Such parameters may include: the extraction flow through the openings 50, the distance between the undersurface 40 and the facing surface (i.e. the flight height), the gas damper length L1 (the length of the undersurface 40 radially outward of the extraction openings 50 to the outer edge 45), as shown in FIG. 9. (The liquid damper length L2 is also illustrated in FIG. 9). To increase the maximum scan speed one or more of these parameters should be optimized. For example the extraction flow through openings 50 should be as high as possible. The flight height should be as low as possible. The gas damper length L1 should be as big as possible.

Unfortunately, every single one of the three mentioned factors may increase the force level and stiffness. For the an embodiment of fluid handling structure 12 the force and stiffness levels are just within specification. Thus the maximum scan speed is limited by the maximum allowable force level and stiffness.

The static force could be reduced by means of an increased supply opening 70 flow. Increasing the flow through the supply opening 70 is undesirable because it involves an expensive supply and extraction system. The increased liquid flow may cause extra disturbance forces on the substrate W. The increased liquid flow through the supply opening 70 may cause immersion fluid leaking into the space 11, affecting the thermal stability and conditioning of the liquid in the space as a consequence.

An embodiment of the invention addresses a substantial problem for further development and advancement of lithography in general: static forces relating to the liquid confinement structure 12 and stiffness of the liquid confinement structure 12.

Figure 10:
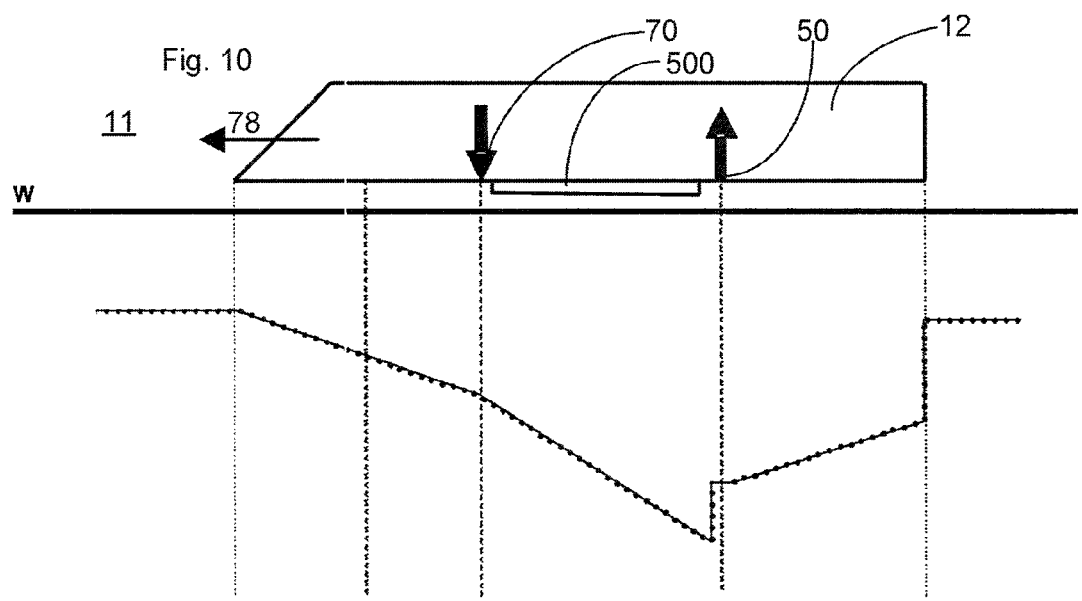
FIG. 10 depicts variation in pressure with radial distance under a fluid handling structure.

A protrusion (or rim) 500 is provided on the undersurface 40, for example, between the supply opening 70 and extraction openings 50. The protrusion may reduce static forces and stiffness of a gas drag fluid handling structure 12 to enable increased scan speeds, as illustrated in FIG. 10. Arrow 78 illustrates bulk flow of immersion liquid across space 11 in an embodiment, for example in a direction parallel to the scanning direction.

FIG. 10 is a very schematic overview of such an arrangement along with a graph of pressure along the y axis. Spots on the graph show the pressure during use of a fluid handling structure 12 with the protrusion 500. The solid line on the graph shows the pressure during use of a fluid handling structure without the extra protrusion 500 between supply opening 70 and extraction openings 50. The force is identical but the supply opening 70 flow is much lower with the protrusion 500. The embodiment shown in FIG. 10 uses a 180 µm gap between extraction openings 50 and the substrate W. Here the protrusion 500 is 40 µm high and 2.5 mm wide but this is just an example. In an embodiment the protrusion is less than 250 µm from the facing surface. In one embodiment the protrusion is between 50 and 200 µm from the facing surface, more desirably between 100 and 150 µm from the facing surface.

In an embodiment the supply opening 70 and/or extraction opening 50 (i.e. distance D1) are more than 100 µm from the surface, desirably between 100 and 250 µm from the surface, for example more than 200 µm. In an embodiment the supply opening 70 and/or extraction opening 50 is between 150 and 200 µm from the surface.

In an embodiment the protrusion protrudes from the undersurface by at least 10 µm. In one embodiment the protrusion protrudes between 10 and 75 µm, more desirably between 25 and 50 µm from the undersurface.

Figure 11:
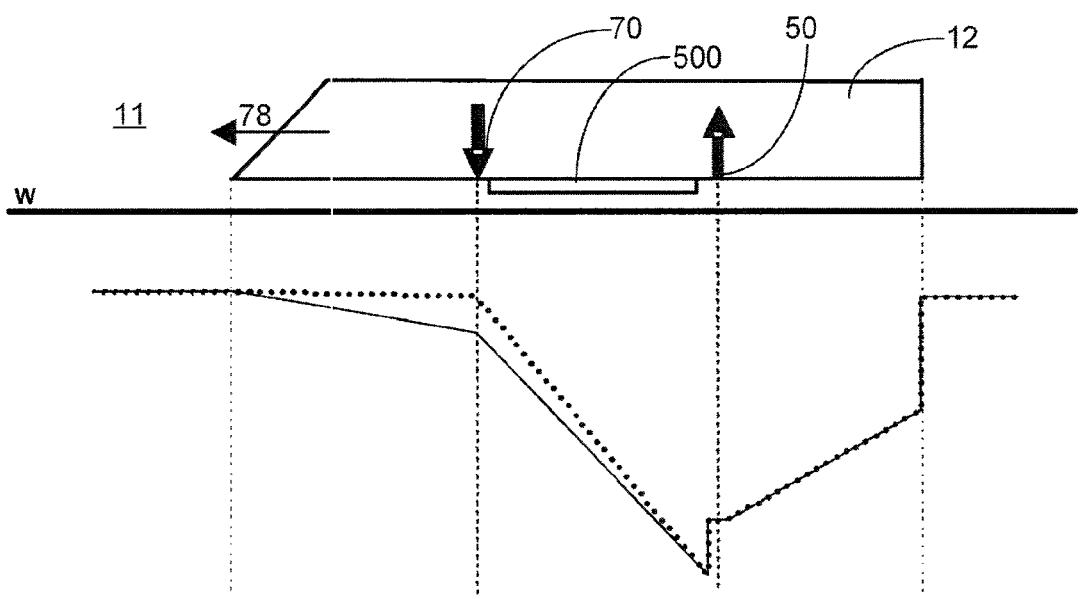
FIG. 11 depicts variation in pressure with radial distance under a fluid handling structure.

FIG. 11 shows the same schematic overview as FIG. 10 but now with a 120 µm gap between the facing surface W, WT and the extraction openings 50. Here the difference in magnitude of the force is somewhat more pronounced, for example noticeable. However, the main benefit of this operational arrangement is that the same (or slightly better) performance is reached at less than half the liquid flow rate out of the supply openings 70. The nonexistent or very low change in force (radially inward of the supply openings 70) for the version with protrusion 500 (which may provide a force magnitude indicated by the spots on the graph) suggests a non existent or very low flow of liquid radially out of space 11 under the undersurface. A radial flow out of the space 11 under the undersurface 40 may be desirable because the bulk flow 78 and flow of liquid under the undersurface 40 (gap flow) are then separate.

Figure 12:
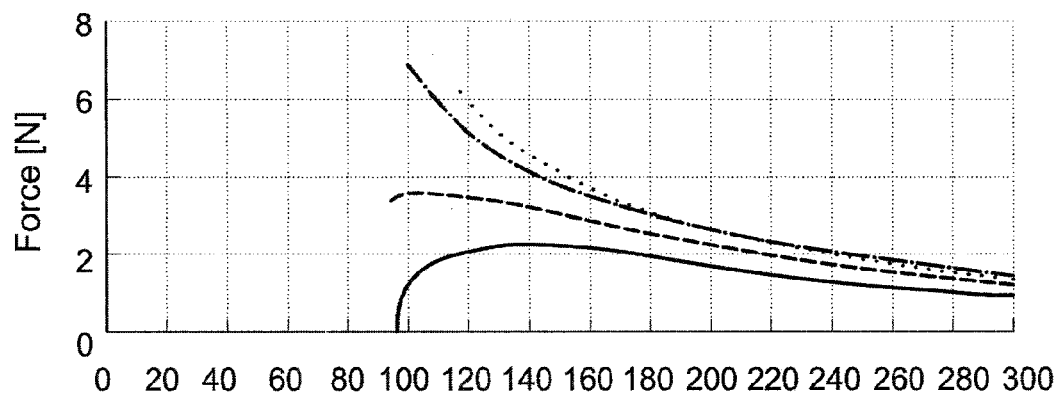
FIGS. 12 and 13 illustrate variations in force and stiffness respectively with distance of an undersurface of the fluid handling structure from the substrate for various different configurations of an embodiment of the present invention.
Figure 13:
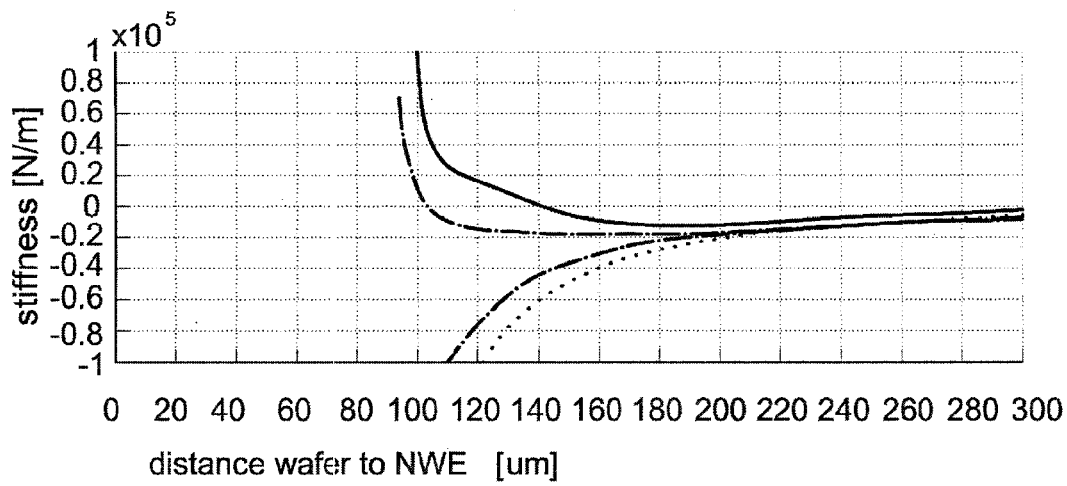

Values of force and stiffness versus distance D1 from substrate W are shown in FIGS. 12 and 13 respectively. The dotted line [ . . . ] represents force and stiffness (derivative of the force) values for a planar (e.g. flat) undersurface of the fluid handling structure 12 (or liquid confinement structure). The solid line [—] shows the effect of just adding a small protrusion (for example 30 μm high, 2 mm wide). The force is a lot less. The stiffness is much lower. Both sets of values are at 2.0 [lpm] supply opening flow. Each set of values may be measurements. The dashed line [- - -] is with a lower supply opening 70 flow (1.5 [lpm]) and the line with alternating dots and dashes [_._._.] is with a very low supply opening 70 flow (1.0 [lpm]). The protrusion 500 helps to reduce the force and stiffness even at a low supply opening 70 flow.

The protrusion 500 helps to control the leakage of immersion liquid from the space 11 towards the extraction openings 50. This may be in addition to the reduction of static force and stiffness. It is especially useful for the protrusion 500 to control leakage from the space 11 in combination with the short liquid damper of U.S. Patent Application Publication No. US 2011-0013158, incorporated herein its entirety by reference. Without the protrusion 500, too much immersion liquid would leak from the space 11 towards the extraction openings 50. If too much liquid leaks towards the extraction openings 50, an unstable meniscus between a top surface of the fluid handling structure 12 and the projection system PS (floating bubbles) may result. Higher disturbance forces due to increased immersion liquid content in the extraction openings 50 may be caused.

Figure 14:
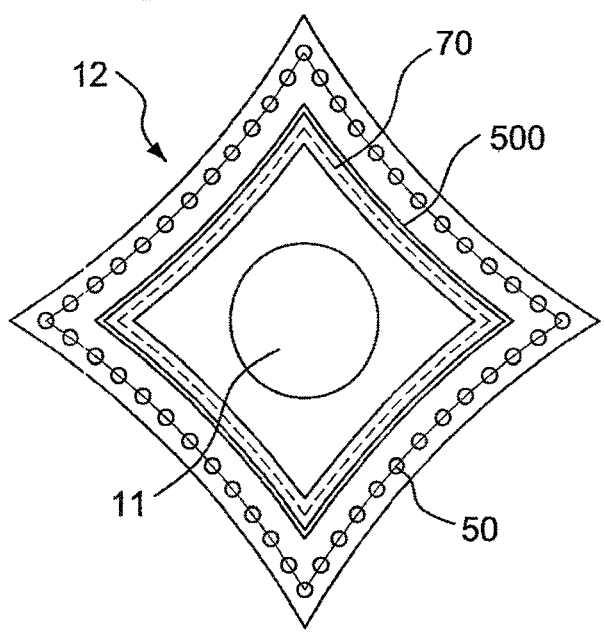
FIG. 14 illustrates schematically, in plan view, the undersurface of a fluid handling structure according to an embodiment of the present invention.

In FIGS. 14 and 15 two rim or protrusion 500 embodiments can be seen. In the FIG. 14 embodiment, the rim 500 is continuous around a periphery of the undersurface, for example the rim is a closed structure around the supply openings 70. In the FIG. 15 embodiment the rim 500 is absent at at least one corner of the shape, in plan, of the fluid handling structure 12. The rim may have two or more components, for example, it may be interrupted in the corners of the shape of the fluid handling structure. The interrupted rim 500 helps to allow more liquid to reach the corner slot 50 (improving stability). For example the interrupted rim 500 helps to prevent de-wetting of the corner slot, without significantly compromising the other benefits of the rim.

Figure 16:
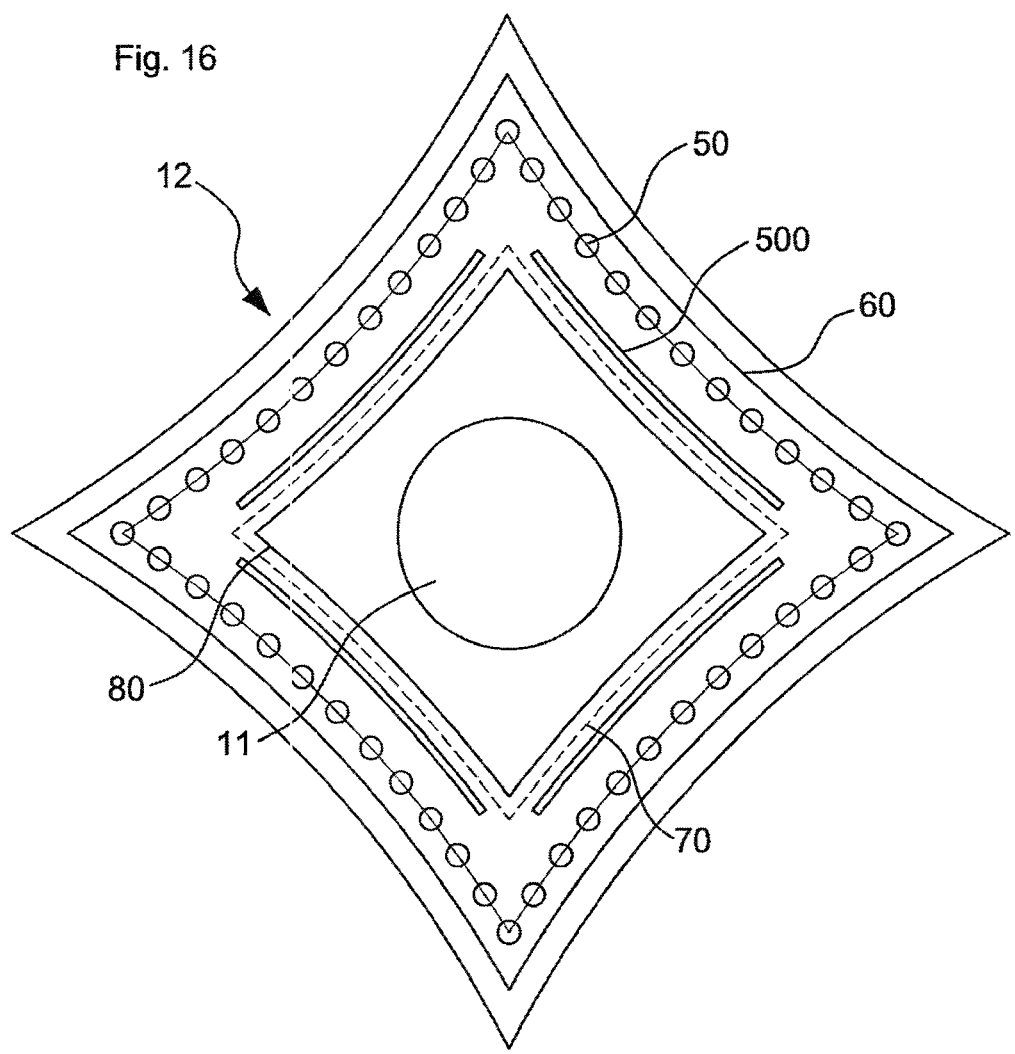
FIG. 16 illustrates in schematic plan view the undersurface of a fluid handling structure according to an embodiment of the present invention.

FIG. 16 is a schematic plan view of an underside of a fluid handling structure 12 of an embodiment of the present invention. The fluid handling structure 12 of FIG. 16 is the same as described above except as described below. In the embodiment of FIG. 16 a gas knife 60 is provided radially outward of the extraction openings 50. The gas knife 60 may be provided as one or more slits which may be substantially parallel to the lines joining the openings 50. In order to reduce or minimize disturbance forces generated by the liquid confinement structure 12, a short liquid damper L2 (see FIG. 9) with an open rim is present. Thus the total area of the liquid confinement structure responsible for the transfer of disturbance forces is desirably reduced or minimized.

In an embodiment a series of discrete apertures may be provided in place of the slits along a side of the shape. In use, the one or more slits are connected to an over pressure and form the gas knife 60 surrounding the meniscus pinning system formed by openings 50. The function of this gas knife is described in U.S. Patent Application Publication No. US 2010-0313974.

The gas knife 60 is desirably close enough to the openings 50 to create a pressure gradient across the volume therebetween. There is desirably no stagnant zone therebetween. A layer of liquid, or liquid droplets desirably does not accumulate therebetween. In an embodiment, the continuous undersurface 40 of fluid handling structure 12 forms a damper which assists in creating the pressure gradient. The undersurface is desirable substantially parallel to the opposing surface of the substrate or substrate table. In an embodiment, the presence of the damper allows the openings 50 to be arranged in a different shape, e.g. a star, than the gas knife, which may be e.g. a square.

Due to the short liquid damper L2 with open rim the outleak of immersion liquid from the space 11 to the bottom side of the liquid confinement structure 12 becomes bigger. This may cause two problems: (1) less immersion liquid flows under the projection system PS across the space 11. This may result in a lower immersion liquid refresh rate of the space 11 which may result in a reduction of the imaging performance; and/or (2) the meniscus of the immersion liquid between the fluid handling structure 12 and the projection system PS becomes unstable. This may result in bubble inclusions in the space 11. These bubbles are then transported with the immersion liquid under the projection system PS and imaged on the substrate which may lead to a defect on substrate W.

Figure 17:
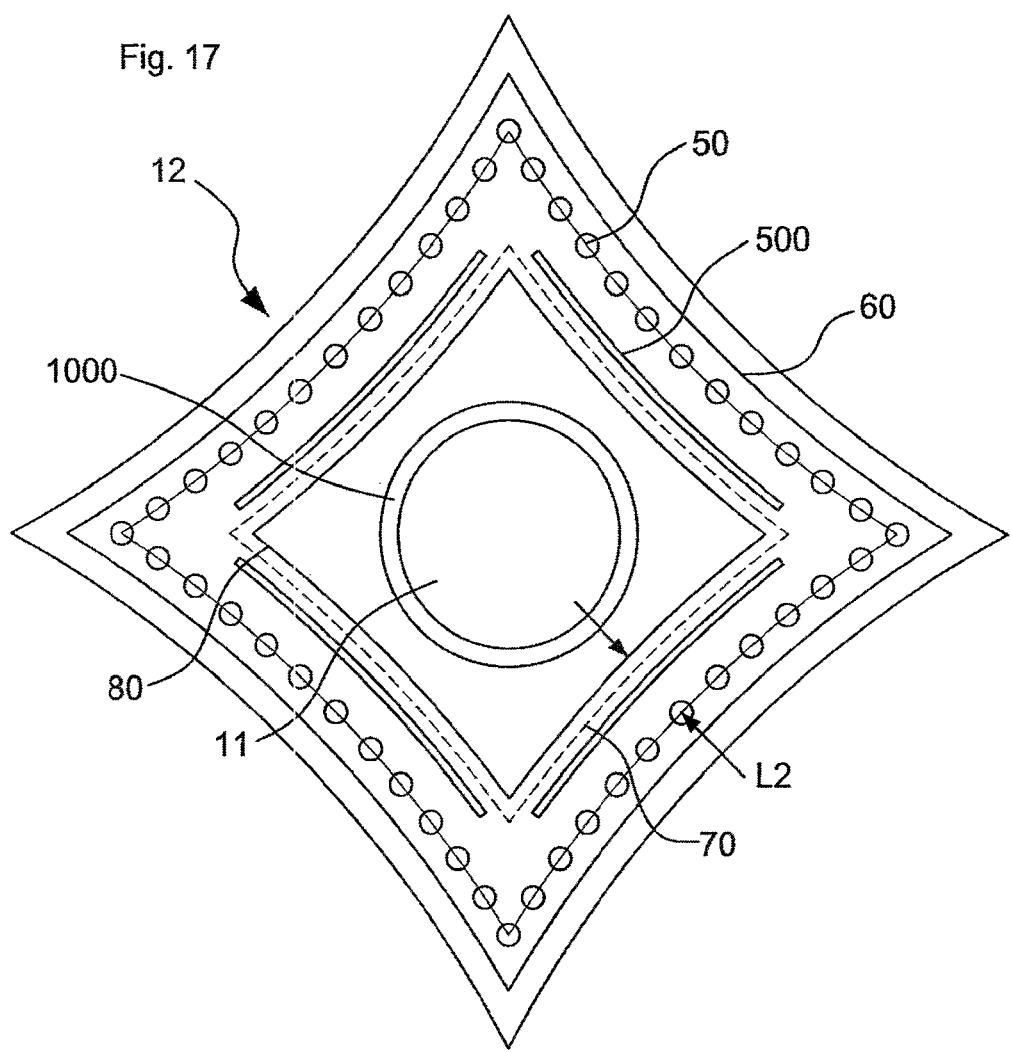
FIG. 17 illustrates the undersurface, in schematic plan view, of a fluid handling structure of an embodiment of the present invention.

To reduce the outleak from the immersion liquid from the space 11 to between the undersurface of the fluid handling structure 12 and a facing surface W, WT, a small restriction 1000 may be added. The restriction may restrict the liquid flow between the space 11 and liquid under the fluid handling structure 12, as illustrated in FIG. 17. FIG. 17 is the same as the above embodiments except as discussed below.

Figure 18:
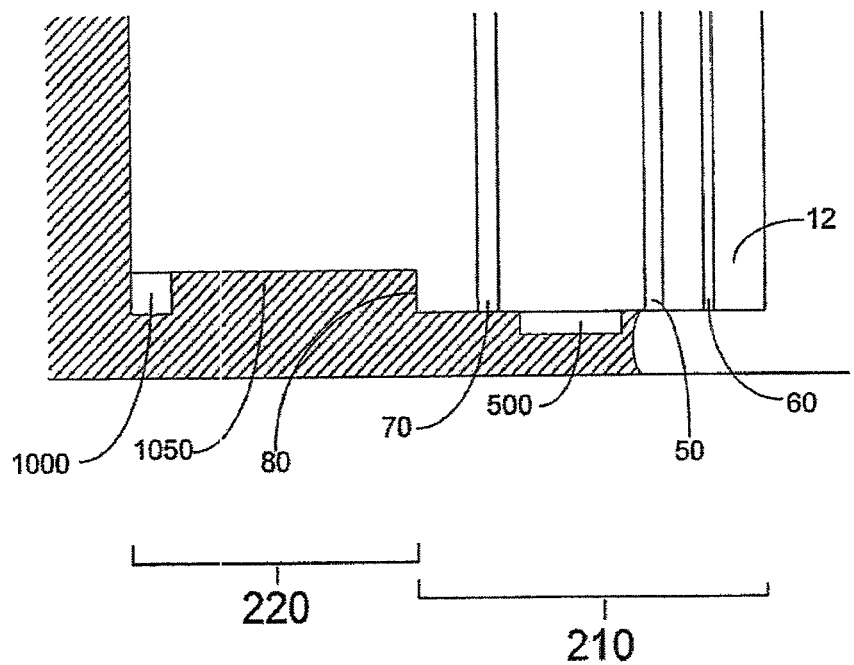
FIG. 18 illustrates in schematic cross-section, the fluid handling structure of FIG. 17.

The restriction 1000 is desirably kept as short as possible in the radial direction e.g. 0.5-2 mm. However, due to manufacturing and strength constraints the restriction 1000 is likely to be at least 0.4 mm long. As illustrated in FIG. 18, the distance between the bottom of the restriction 1000 and the facing surface W, WT may be substantially the same as the distance between the undersurface of the liquid confinement structure 12 in which the openings 50, 70 are defined (i.e. distance D0, e.g. the surface of the first portion 210. For example, the distance between the restriction 1000 and the facing surface W, WT may be more than 100 μm, desirably between 100 and 250 μm, more desirably between 150 and 200 μm. The total area of this restriction 1000 is desirably small. The area of the restriction 1000 is not expected to significantly increase the disturbance forces of the liquid confinement structure 12. The restriction 1000 can be all around the space 11 and/or segmented if needed.

FIG. 17 shows a bottom side of fluid handling structure 12 with a short liquid damper L2 and rim 1000. FIG. 18 is a cross section of fluid handling structure 12 with the short liquid damper L2 and the restriction 1000. The restriction 1000 may be formed on the second portion 220. The arrangement at the radially inner second portion 220 may be regarded as defining a recess 1050 in the undersurface of the fluid confinement structure 12 which may otherwise be planar.

In an embodiment the undersurface of the fluid handling structure 12, on which the restriction 1000, opening 50, opening 70 and protrusion 500 are formed, is in one plane.

In any of the above embodiments, the restriction 1000 may be present on a fluid handling structure 12, but the protrusion 500 may be absent.

Figure 19:
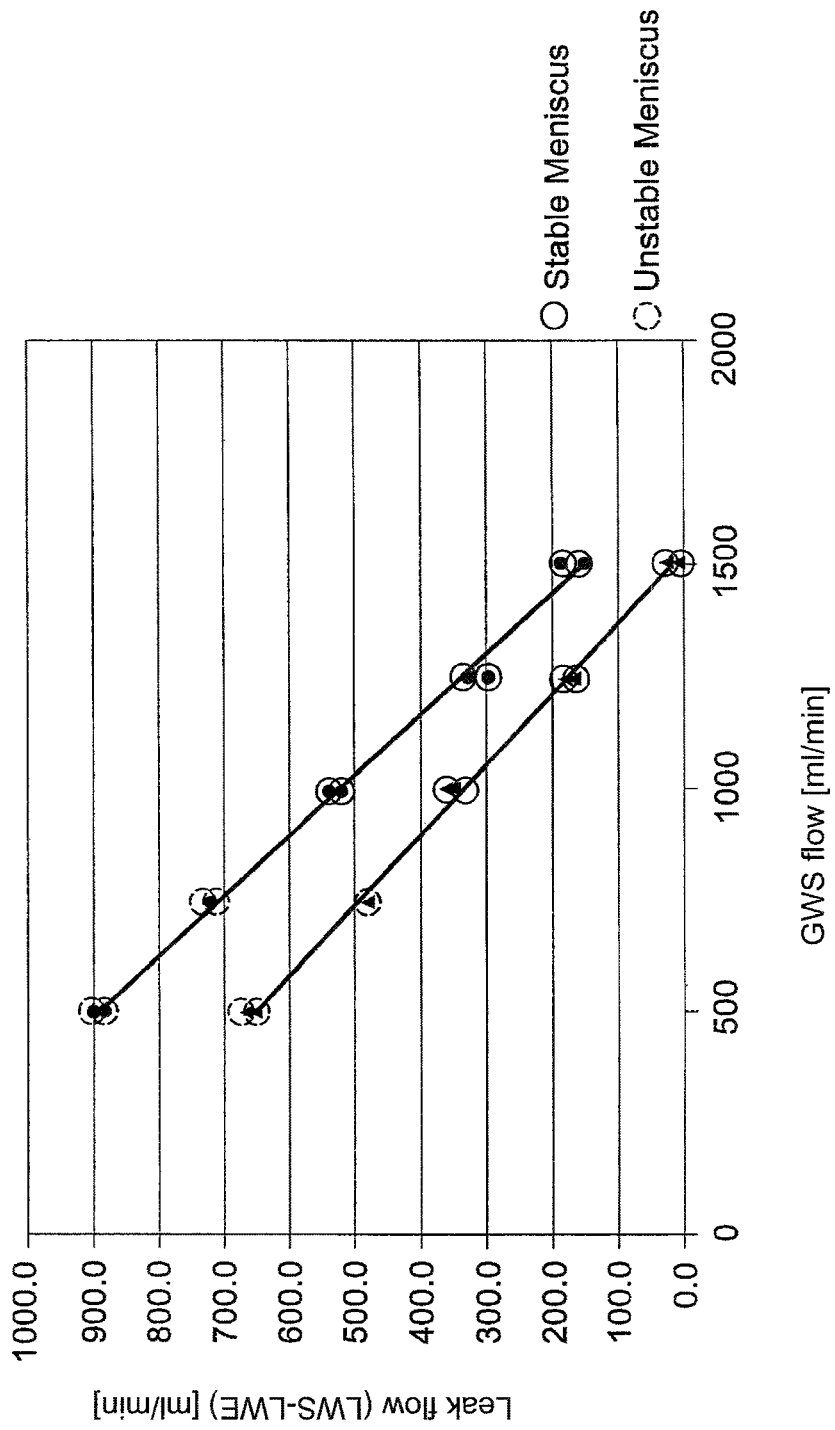
FIG. 19 illustrates variations in flow from the space 11 to the gap between the liquid confinement structure 12 and the facing surface on the y axis versus flow of liquid out of openings 70 along the x axis.

FIG. 19 is a graph showing experimental results for a fluid handling structure 12 of FIGS. 16 and 17 with and without the restriction 1000. Plotted on the y axis is the difference in flow rate between the flow 78 into space 11 and the flow into openings 50 from the space 11 i.e. total flow through openings 50 less flow from space 11. The values indicated by the y axis is a measure of the amount of liquid which flows from the space 11 to the openings 50. Plotted along the x axis is the flow out of the openings 70. The results were determined with a distance D1 between the facing surface and the openings 50, 70 of 180 μm. The results with circles indicate results without the restriction 1000. The results indicated with triangles illustrate results with the same set up but with a restriction 1000. An outlet flow of 100 L/min out of openings 50 was used. The results at which a stable meniscus between the liquid confinement structure 12 and the projection system was determined have filled in shapes to indicate the presence of a stable meniscus which may be detected or determined. As can be seen, the meniscus is stable for low leak flows. If a restriction 1000 is used, a stable meniscus is achieved at an even lower fluid flow rate out of the openings 70. A lower flow rate of out openings 70 may be desirable because less flow needs to be provided.

As will be appreciated, any of the above described features can be used with any other feature and it is not only those combinations explicitly described which are covered in this application.

In an embodiment, there is provided a fluid handling structure configured to supply immersion liquid to a space defined between a projection system and a facing surface facing the fluid handling structure, wherein an undersurface of the fluid handling structure has: a supply opening configured to supply fluid toward the facing surface; a plurality of extraction openings configured to remove fluid from between the fluid handling structure and the facing surface; and a protrusion between the supply opening and the extraction openings.

In an embodiment, in use, the supply opening and extraction openings are substantially the same distance from the facing surface. In an embodiment, in use, a gap between the protrusion and the facing surface is smaller than a gap between the supply opening and the facing surface or between the extraction openings and the facing surface. In an embodiment, in use, the protrusion is less than 250 μm, desirably between 50 and 200 μm from the facing surface, more desirably between 100 and 150 μm from the facing surface. In an embodiment, in use, the supply opening and/or extraction openings are more than 100 μm from the surface, desirably between 100 and 250 μm from the surface, more desirably between 150 and 200 μm from the surface. In an embodiment, the protrusion protrudes from the undersurface by at least 10 μm, desirably between 10 and 75 μm, more desirably between 25 and 50 μm. In an embodiment, at least part of the supply opening and/or at least one of the extraction openings is arranged, in plan, in a cornered shape. In an embodiment, the extraction openings substantially surround the supply opening. In an embodiment, the fluid handling structure further comprises a gas knife device having an elongate aperture defined in the undersurface. In an embodiment, the elongate aperture substantially surrounds the extraction openings. In an embodiment, the protrusion forms a closed loop around the supply opening. In an embodiment, the fluid handling structure further comprises at least one additional protrusion, the protrusion and the additional protrusion being arranged to surround the supply opening except at corners of the shape, in plan, in which the supply opening is arranged. In an embodiment, the supply opening comprises a plurality of supply openings. In an embodiment, the protrusion has a continuous surface. In an embodiment, the surface of the protrusion is a planar surface. In an embodiment, in use, the surface of the protrusion is parallel to the facing surface. In an embodiment, a step is present in an undersurface of the fluid handling structure between the protrusion and a part of the undersurface in which the supply opening is formed or a part of the undersurface in which the plurality of extraction openings is formed, or both.

In an embodiment, there is provided a fluid handling structure configured to supply immersion liquid to a space defined between a projection system and a facing surface facing the fluid handling system, wherein an undersurface of the fluid handling structure has: a supply opening configured to supply fluid toward the facing surface; and a protrusion radially inward with respect to an optical axis of the projection system of the supply opening.

In an embodiment, one or more openings to extract fluid are formed in the undersurface. In an embodiment, the one or more openings are radially outward of the supply opening. In an embodiment, the protrusion is formed in a second portion of the undersurface which is in a different plane to the plane of a first portion of the undersurface in which the supply opening is formed. In an embodiment, the second portion is, in use, further from the facing surface than the first portion.

In an embodiment, there is provided a fluid handling structure configured to supply immersion liquid to a space between a projection system and a facing surface facing the fluid handling system, wherein formed in an undersurface of the fluid handling structure is: one or more of supply openings to supply immersion liquid towards the facing surface; and a step in the surface of the undersurface radially outward of the one or more supply openings with respect to a geometric center of the undersurface, the step configured to reduce the radially outward flow of immersion liquid from the space.

In an embodiment, the fluid handling structure is configured to supply immersion liquid only to a localized area of a substrate and/or substrate table.

In an embodiment, there is provided an immersion lithographic apparatus comprising: a projection system to project a beam of radiation onto a substrate supported by a substrate table; and a fluid handling structure as disclosed herein, wherein the facing surface is the surface of the substrate and/or the surface of the substrate table.

In an embodiment, there is provided a device manufacturing method comprising: providing a fluid between a final element of a projection system and a substrate; wherein the providing includes supplying liquid towards the substrate through a supply opening in an undersurface of the fluid handling structure and removing fluid from between the fluid handling structure and the substrate and/or substrate table through an extraction opening in the undersurface of the fluid handling structure, wherein a protrusion is provided on the undersurface between the supply opening and the extraction opening.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure configured to supply immersion liquid to a space defined between a projection system and a facing surface facing the fluid handling structure, wherein an undersurface of the fluid handling structure has:
   a supply opening configured to supply fluid toward the facing surface;
   a plurality of extraction openings configured to remove fluid from between the fluid handling structure and the facing surface; and
   a protrusion between the supply opening and the extraction openings.

2. The fluid handling structure of claim 1, wherein, in use, the supply opening and extraction openings are substantially the same distance from the facing surface.

3. The fluid handling structure of claim 1, wherein, in use, a gap between the protrusion and the facing surface is smaller than a gap between the supply opening and the facing surface or between the extraction openings and the facing surface.

4. The fluid handling structure of claim 1, wherein, in use, the protrusion is less than 250 μm from the facing surface.

5. The fluid handling structure of claim 1, wherein, in use, the supply opening and/or extraction openings are more than 100 μm from the surface.

6. The fluid handling structure of claim 1, wherein the protrusion protrudes from the undersurface by at least 10 μm.

7. The fluid handling structure of claim 1, wherein at least part of the supply opening and/or at least one of the extraction openings is arranged, in plan, in a cornered shape.

8. The fluid handling structure of claim 1, wherein the extraction openings substantially surround the supply opening.

9. The fluid handling structure of claim 1, further comprising a gas knife device having an elongate aperture defined in the undersurface.

10. The fluid handling structure of claim 9, wherein the elongate aperture substantially surrounds the extraction openings.

11. The fluid handling structure of claim 1, wherein the protrusion forms a closed loop around the supply opening.

12. The fluid handling structure of claim 1, further comprising an additional protrusion, the protrusion and the additional protrusion being arranged to surround the supply opening except at corners of the shape, in plan, in which the supply opening is arranged.

13. The fluid handling structure of claim 1, wherein the supply opening comprises a plurality of supply openings.

14. The fluid handling structure of claim 1, wherein the protrusion has a continuous surface.

15. The fluid handling structure of claim 1, wherein the surface of the protrusion is a planar surface.

16. The fluid handling structure of claim 1, wherein, in use, the surface of the protrusion is parallel to the facing surface.

17. The fluid handling structure of claim 1, wherein a step is present in an undersurface of the fluid handling structure between the protrusion and a part of the undersurface in which the supply opening is formed or a part of the undersurface in which the plurality of extraction openings is formed, or both.

18. A fluid handling structure configured to supply immersion liquid to a space defined between a projection system and a facing surface facing the fluid handling structure, wherein an undersurface of the fluid handling structure has:
- a supply opening configured to supply fluid toward the facing surface;
- a plurality of extraction openings configured to remove fluid from between the fluid handling structure and the facing surface;
- a first protrusion between the supply opening and the extraction openings; and
- a second protrusion radially inward with respect to an optical axis of the projection system of the supply opening.

19. The fluid handling structure of claim 18, wherein the plurality of extraction openings configured to remove fluid are radially outward of the supply opening.

20. The fluid handling structure of claim 18, wherein the second protrusion is formed in a second portion of the undersurface which is in a different plane to the plane of a first portion of the undersurface in which the supply opening is formed.

21. The fluid handling structure of claim 20, wherein the second portion is, in use, further from the facing surface than the first portion.

22. A fluid handling structure configured to supply immersion liquid to a space between a projection system and a facing surface facing the fluid handling structure, wherein formed in an undersurface of the fluid handling structure is:
- a supply opening to supply immersion liquid towards the facing surface;
- a plurality of extraction openings configured to remove fluid from between the fluid handling structure and the facing surface;
- a protrusion between the supply opening and the extraction openings; and
- a step in the surface of the undersurface radially outward of the supply opening with respect to a geometric center of the undersurface, the step configured to reduce the radially outward flow of immersion liquid from the space.

23. An immersion lithographic apparatus comprising:
- a projection system to project a beam of radiation onto a substrate supported by a substrate table; and
- a fluid handling structure configured to supply immersion liquid to a space defined between the projection system and a facing surface facing the fluid handling structure, wherein the facing surface is the surface of the substrate and/or the surface of the substrate table and an undersurface of the fluid handling structure has:
  - a supply opening configured to supply fluid toward the facing surface;
  - a plurality of extraction openings configured to remove fluid from between the fluid handling structure and the facing surface; and
  - a protrusion between the supply opening and the extraction openings.

24. The immersion lithographic apparatus of claim 23, wherein the fluid handling structure is configured to supply immersion liquid only to a localized area of a substrate and/or substrate table.

25. A device manufacturing method comprising:
- providing a fluid between a final element of a projection system and a substrate;
- wherein the providing includes supplying liquid towards the substrate through a supply opening in an undersurface of the fluid handling structure and removing fluid from between the fluid handling structure and the substrate and/or substrate table through an extraction opening in the undersurface of the fluid handling structure, wherein a protrusion is provided on the undersurface between the supply opening and the extraction opening.

* * * * *